United States Patent
Nakamura et al.

(10) Patent No.: US 6,555,756 B2
(45) Date of Patent: Apr. 29, 2003

(54) PRINTED WIRING BOARD HAVING CAVITY FOR MOUNTING ELECTRONIC PARTS THEREIN AND METHOD FOR MANUFACTURING THEREOF

(75) Inventors: Yasuaki Nakamura, Odawara (JP); Masayuki Sakurai, Tokyo (JP); Kazumitsu Ishikawa, Odawara (JP); Hiroyuki Kudoh, Odawara (JP)

(73) Assignee: Hitachi AIC, Inc., Tokyo (JP)

( * ) Notice: Subject to any disclaimer, the term of this patent is extended or adjusted under 35 U.S.C. 154(b) by 0 days.

(21) Appl. No.: 09/855,671

(22) Filed: May 16, 2001

(65) Prior Publication Data

US 2001/0042640 A1 Nov. 22, 2001

(30) Foreign Application Priority Data

May 23, 2000 (JP) .......................................... 2000-150758
May 16, 2000 (JP) .......................................... 2000-142794

(51) Int. Cl.⁷ ................................................ H05K 1/03
(52) U.S. Cl. .................... 174/255; 174/262; 174/264; 174/266; 361/767; 361/792; 361/795
(58) Field of Search ............................... 174/255, 261, 174/262, 263, 264, 266, 260; 361/767, 774, 792, 795, 809, 760, 796; 439/74, 65; 257/778, 779, 737, 738

(56) References Cited

U.S. PATENT DOCUMENTS

| | | | | | |
|---|---|---|---|---|---|
| 4,383,363 A | * | 5/1983 | Hayakawa et al. | .......... | 174/254 |
| 5,243,142 A | * | 9/1993 | Ishikawa et al. | ............ | 174/258 |
| 5,714,239 A | * | 2/1998 | Maeda et al. | ................ | 174/250 |
| 5,814,883 A | * | 9/1998 | Sawai et al. | ................ | 257/675 |
| 5,994,771 A | * | 11/1999 | Sasaki et al. | ................ | 257/700 |
| 6,014,314 A | * | 1/2000 | Mikubo | ..................... | 165/80.3 |
| 6,163,456 A | * | 12/2000 | Suzuki et al. | ................ | 361/704 |
| 6,229,404 B1 | * | 5/2001 | Hatanaka | ..................... | 257/698 |
| 6,285,559 B1 | * | 9/2001 | Fukiharu | ..................... | 333/186 |
| 6,297,551 B1 | * | 10/2001 | Dudderar et al. | ........... | 257/686 |
| 6,303,881 B1 | * | 10/2001 | Parker et al. | ............... | 174/256 |
| 6,324,067 B1 | * | 11/2001 | Nishiyama | ................... | 174/262 |

FOREIGN PATENT DOCUMENTS

JP 4-91489 3/1992

* cited by examiner

Primary Examiner—David L. Talbott
Assistant Examiner—I B Patel
(74) Attorney, Agent, or Firm—Antonelli, Terry, Stout, Kraus, LLP

(57) ABSTRACT

A printed wiring board (1) having a cavity (20) for mounting electronic parts therein and a method for manufacturing thereof, comprising: an upper wiring substrate (1A) having flat surfaces on both sides; a lower plate body (1B) being fixed on a reverse side surface of the upper wiring substrate, and being formed with the cavity (20) in a part thereof, for receiving an electronic part (30) within an inside thereof; conductor layers (3) provided on both side surfaces of the upper wiring substrate for mounting electronic parts thereon, by forming plated through-holes (7) or flat through-holes (7'), in particular with in a region of the cavity on the reverse side surface thereof; and external electrodes (5) formed on side-end surface or on a lower-end surface of the printed wiring board, wherein at least an electronic part, for example, hybrid IC, chip-like parts, functional parts, such as SAW filter, sensor parts, etc., can be received or stored within a space of the cavity (20), thereby enabling the mounting of the electronic parts thereon with high density and reliability, such as on a motherboard (40).

16 Claims, 8 Drawing Sheets

PRINTED WIRING BOARD HAVING CAVITY FOR MOUNTING ELECTRONIC PARTS THEREIN AND METHOD FOR MANUFACTURING THEREOF

BACKGROUND OF THE INVENTION

1. Field of the Invention

The present invention relates to a printed wiring board for use in mounting or packaging electronic parts therein, and in particular a printed wiring board having a cavity for mounting electronic parts therein and a method for manufacturing thereof, thereby enabling to mount the electronic parts, for example on a mother board, etc., with high density thereof.

2. Description of the Prior Art

Conventionally, mounting or packaging is carried out by loading plural numbers of electronic parts or components, such as semiconductor elements and/or chip-like parts, etc., on a surface of a plate-like printed wiring board, on which a predetermined circuit patterns are formed, so as to form a module (or a module board), and this module obtained is further piled on a motherboard, etc., flatly, in a form of a hybrid IC.

By referring to FIG. 11, explanation will be given on packaging condition where the electronic parts are mounted on the plate-like printed wiring board 10 of the conventional art, so as to form the module therewith, and after that this is piled on the motherboard flatly.

First of all, on the plate-like printed wiring board 10 of a single or multi-layered substrate or board are formed conductor layers 3, such as predetermined circuit patterns, lands for use in connection of electronic parts, plated through-holes 4, and side end-surface electrodes 5, etc. After that, chip-like electronic parts 3 are fixed upon the surfaces of the lands 3, which are formed on the surface of the plate-like printed wiring board 10 mentioned above, thereby being electrically connected therewith.

Next, the module board mounting the plural numbers of the chip-like electronic parts 30 thereon is heated and mounted, to be connected onto connector terminals 45 provided on the motherboard 40, with using side end-surface electrodes 5 which are provided on the plate-like printed wiring board 10. However, for the purpose of mounting the module board, on which the plural number of the chip-like electronic parts 30 are mounted, on the motherboard 40 with stability, in general, no such an element, as the chip-type electronic parts 30, is mounted on a lower surface of said the plate-like printed wiring board 10, which defines a reverse surface side thereof.

On the other hand, when the module board, being formed by mounting the chip-like electronic parts 30 on both side surfaces of the plate-like printed wiring board 10 mentioned above, is mounted on the motherboard 40, it is fixed on the motherboard 40 through a spacer plate, a connector, and/or a pin board, etc., which is/are attached on the reverse side flat surface of the module plate, i.e., a mounted side (a lower side) thereof.

Accompanying by high- and multi-functions required for electronic and electric equipments in the recent years, those requirements of such the high- and multi-functions are also demanded onto the module board and the hybrid IC, etc. Accordingly, also for the printed wiring board, such the requirements of such the high- and multi-functions, as well as of high density and minuteness in lines to be formed, are made strongly, therefore the printed wiring board is needed to be more complex in the form and structure thereof.

For achieving such the high-density mounting required for the printed wiring board, so-called a flat through-hole is already known, as is disclosed in Japanese Patent Laying-open No. Hei 4-91489 (1992), wherein electrically insulating resin is filled up and harden within the plated through-holes formed on the wiring board, to be formed with connector portions, such as the bonding pads and/or the connector lands, upon the surfaces thereof, thereby utilizing even the surfaces of the plated through-holes formed thereon.

As was mentioned in the above, in the conventional art, in general, no such the chip-like electronic element is allowed to be mounted on the reverse side surface (i.e., the lower side surface) of the plate-like printed wiring board, because of the surface to be mounted on. However, for the purpose of improving the mounting density, it is required that the chip-like electronic parts can be mounted, not only the surface of the plate-like printed wiring board, but also on the reverse side surface thereof. And, for mounting such the module board, on both surfaces of which the chip-like electronic parts are mounted, on the motherboard closely contact therewith, there is a necessity of floating it up from the surface of the motherboard, with aid of attaching the spacers and/or the connectors at a lower side (i.e., the lower surface) of the module plate, which faces or confronts to the motherboard.

However, if floating up the plate-like printed wiring board by means of such the spacers and/or the connecters, so as to mount it on the motherboard, it is difficult to mount it on the motherboard with stability, i.e., it is difficult to mount the chip-like electronic parts on the lower side (i.e., the lower surface) of the plate-like printed wiring substrate, flatly and closely contacted with, as well as, with high mounting density thereof.

SUMMARY OF THE INVENTION

An object of the present invention, accordingly, for dissolving such the problems of the conventional art mentioned above, is to provide a printed wiring board having a cavity for mounting the electronic parts therein and a method for manufacturing thereof, namely, enabling to mount the chip-like electronic parts, not only the surface of the plate-like wiring board, but also on the reverse side surface thereof, thereby achieving mounting or packaging of the chip-like electronic parts with high density, while keeping them closely contact with, and horizontally on the motherboard.

According to the present invention, for accomplishing such the object as mentioned above, there is provided a printed wiring board, comprising:

an upper wiring substrate having flat surfaces on both sides thereof;

a lower plate body being fixed on the reverse side surface said upper wiring substrate, and being formed with a cavity therein, for receiving an electronic part within an inside thereof;

conductor layers being formed upon the surface of said upper wiring substrate, for mounting an electronic part thereon;

conductor layers being formed on a reverse side surface said upper wiring substrate, for mounting an electronic part thereon, facing to a region where said cavity is defined by said lower plate body, and being electrically connected with the conductor layers formed on the surface of said upper wiring substrate, respectively; and external electrodes being formed on portions of an outer peripheral surface of said upper wiring substrate and said lower plate body formed in one body, and being electrically connected with said conductor layers, respectively, for mounting said printed wiring board on an outside substrate.

Also, according to the present invention, on the printed wiring board mentioned above, a plated through-hole is formed between the surfaces of the upper wiring substrate, for interconnecting the conductor layers, to be mounted with an electronic parts on the both sides of said upper wiring plate, and is filled with electrically non-conductive resin in an inside thereof, or alternatively a flat through-hole may be formed in the place thereof. Herein, the "flat through-hole (or flat plated through-hole)" means the structure or method for forming the conductor layer(s) to be a circuit conductor or a conductor pad for use in mounting of electronic parts thereon, with aggressively utilizing both side surfaces or one surface of so-called "a buried through-hole" formed in the substrate, within plated electrode of which is filled up or buried the non-conductive resin, and it is also the same in the explanations given hereinafter. Also, in the following explanations, the "through-hole" means the plated through-hole, having the inner electrode formed on the wall surface of the hole through plating, even when omitting the word "plated" at a head thereof.

Further, according to the present invention, in the printed wiring board mentioned above, said external electrodes are formed on side-end surfaces of said printed wiring board, or alternatively on a lower end surface of said printed wiring board. And, said external electrodes can be made of metal conductors of a "bottomed through-hole", each being formed on said printed wiring board penetrating through the upper wiring substrate and the lower plate body and is closed at a lower end thereof.

Further, according to the present invention, in the printed wiring board mentioned above, said lower plate body is formed in either a gate-like shape or a frame-like shape in a plane view thereof, and said lower plate body has a thickness being a little bit larger than that of the electronic part received within said cavity formed. In particular, depth (h) of the cavity of said lower plate body lies within a range from 30% to 90% of thickness (t) of said printed wiring board. Moreover, it is preferable that openings or gaps are hermetically sealed with a resin or molding material, after the electronic part is mounted to be received within the cavity of said lower plate body.

Also, according to the present invention, for accomplishing the object mentioned above, there is further provided a method for manufacturing a printed wiring board, comprising a sequence of the following steps:

(a) forming a through-hole on an upper wiring substrate, on both surfaces of which are lamented conductor foils, and filling up filler within said through-hole formed;

(b) forming predetermined conductor layers for connection of electronic parts thereon on one surface of said upper wiring substrate, which are electrically connected through said through-hole formed;

(c) preparing a lower plate boy, being laminated with conductor foil on at least one surface thereof and formed with a cavity for receiving an electronic part in a part thereof, and bonding said lower plate body onto the one surface of said upper wiring substrate with a surface opposing to that being laminated with the conductor foil; and (d) forming external electrodes for mounting said printed wiring board on an outside substrate, on portions of an outer peripheral surface of said upper substrate and said lower plate body formed in one body, with predetermined conductor layers for connecting electronic parts thereon.

According to the present invention, in the method for manufacturing a printed wiring board mentioned above, the through-hole formed in the step of the (a) mentioned above is a flat through-hole, in which conductor layers are formed on both end surfaces of the filler filled up within said through-hole, or said cavity is filled up with resin in advance when forming the predetermined conductor layers for connecting the electronic parts thereon in said step(d), or the step for forming said external electrodes in said step (d) includes a step for forming bottomed through-holes, each of which penetrates through said upper substrate and said lower plate body bonded to each other and is closed at a lower end thereof.

BRIEF DESCRIPTION OF THE DRAWINGS

Those and other features, objects and advantages of the present invention will become more apparent from the following description when taken in conjunction with the accompanying drawings wherein.

DETAILED DESCRIPTION OF THE INVENTION

Hereinafter, embodiments according to the present invention will be fully explained by referring to the attached drawings.

Figure 1:
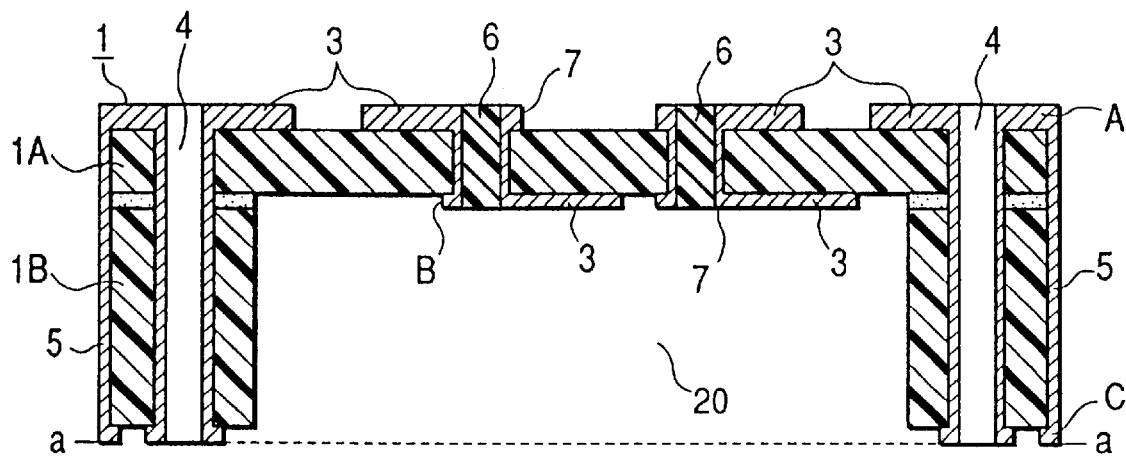
FIG. 1 is a cross-section view of a printed wiring board having a cavity for mounting electronic parts therein, according to one embodiment of the present invention.

First of all, FIG. 1 shows a cross-section view of a printed wiring board according to an embodiment of the present invention, which comprises a cavity for mounting an electronic part therein. As shown in the figure, the printed wiring board 1 according to the present invention has a plate-like upper plate or substrate 1A made of electrically insulating material, on both side surfaces of which are formed conductor layers 3, such as connector lands, bonding pads, connector pads, etc., for use in electrical and mechanical connection of electronic parts or elements thereon. On the upper substrate 1A are formed through-holes 7 for obtaining the electrical conduction between both surfaces thereof, and in the present embodiment, the through-holes 7 formed are filled up with resin 6 of non-conductive therein.

On this printed wiring board 1 according the present invention, a lower plate body or layer 1B of electrically insulating material, being formed in either a gate-like or a frame-like shape in a plane view thereof, is further bonded upon one surface thereof, for example a lower side surface of the upper substrate 1A, so that it extends below in a skirt-like manner, thereby forming a cavity 20 for receiving or storing an electronic part(s) or component(s) therein, in a portion of the printed wiring board 1. Further, a feature of the cavity 20 for receiving the electronic part therein lies, as apparent from the figure, that it is opened in direction of a lower portion of the printed wiring board 1, and that the conductor layers 3 are formed on a reverse side surface thereof, which defines a wall surface of that cavity 20, for mounting (bonding) the electronic part(s) received within the cavity 20. Namely, with the printed wiring board 1 according to the present invention, the electronic part(s) can be inserted into the cavity 20 opened below and be mounted therein, so that it does not exceed over a bottom surface or level (a—a) thereof. Also, with the printed wiring board 1 according to the present invention, on the flat surface on the upper side thereof are also formed the conductor layers 3, such as the connector lands, the bonding pads, the connector pads, etc., thereby, of course, enabling the mounting of the electronic part(s) on the upper side surface, too.

In this figure, though it will be explained later again, reference marks A and B indicate the conductor layers constructing the printed wiring board 1. Also, a reference numeral 5 in the figure indicates external electrodes, for electrically connecting the printed wiring board 1 onto an outside substrate, such as a motherboard and the like, after being mounted on both side surfaces thereof with the chip-like electronic parts, i.e., in a form of a module substrate. In this example, they are formed on each of side end surfaces of the printed wiring board 1. Further, a reference numeral 4 depicts through-holes formed for obtaining electrical conduction between the both side surfaces of the printed wiring board 1 as a whole, and a mark C the conductor layer formed on the lower surface of the lower plate body 1B. With this layer, in the place of the above-mentioned external electrodes 5 formed on side-end surfaces, the printed wiring board 1 also can be connected on the motherboard through surface-bonding, with provision of a connector pad, such as BGA (Ball Grid Allay) of solder balls, etc., upon the conductor layer C on the lower surface of the printed wiring board 1.

Hereinafter, a manufacturing method will be explained of the printed wiring board 1 mentioned above.

First, a plate-like wiring substrate or plate, on both side of which are formed conductor layers, such as a copper foil or the like, or a multi-layer printed wiring substrate formed by laminating such the wiring board in plural numbers thereof is prepared, and then it is formed with the through-holes 7 therein for connecting between the conductor layers A and B on both side surfaces thereof, thereby obtaining the upper substrate 1A of the printed wiring board 1. After that, into the through-holes 7 formed on a surface thereof, in particular, within a region of the lower surface of the upper substrate 1A defining a portion of the wall surface of the cavity 20, non-conductive resin is filled up with and is hardened or cured to be fillers 6, so that flux, seal resin, processing liquid, solder, etc., cannot penetrate into inside through them in processing thereafter, thereby forming a so-called a buried or filled through-hole. Further on both surfaces of the upper substrate 1A, the conductor layers 3 are provided in the form of connector terminals, such as the connector lands, the bonding pads, the connector pads, etc., in the vicinity of those buried through-holes 7.

On the other hand, for the purpose of constructing the lower plate body 1B of the printed wiring board 1, a plate being laminated with a predetermined conductor layer only on one side thereof is prepared. At a predetermined location (s) therein, a penetrating hole(s) is/are formed by means of, for example, press working, punching, rooter machining, milling, laser beam machining, etc., as to form the cavity 20 for receiving the electronic part(s) therein, thereby completing the lower plate body 1B having the shape or structure of the gate-like or the frame-like shape.

Next, on the lower surface (the reverse side surface) of the upper substrate 1A mentioned above, prepreg, adhesive sheet, or adhesive, etc., is attached or pasted, except for the portion for defining the cavity 20 mentioned above, and this is laminated on the upper wiring substrate 1A with application of heat and compression, thereby forming the printed wiring board 1 equipped with the cavity for receiving the electronic part(s) within an inside thereof. Thereafter, the electrodes 5 are formed on the side-end surfaces of it, and/or the through-holes 7 are formed for electrically connecting between both side surfaces of the wiring board as a whole, thereby completing the printed wiring board 1 mentioned above.

In a case where the electronic parts are mounted with using the printed wiring board 1 mentioned above, for example, the chip-like electronic parts to be loaded are mounted, of course, not only on the upper surface of the upper wiring board 1A, but also on the lower surface (the reverse side) thereof through the conductor layers 3 formed on the both surfaces thereof. Thus, the electronic part(s) mounted on the lower surface (the reverse side surface) of the upper wiring board 1A is/are stored within the cavity 20 formed in the lower plate body 1B.

As the substrate for forming the upper wiring substrate 1A and the lower plate body 1B of the above-mentioned printed wiring board 1, they can be selected from those, which are obtained through impregnating a thermally curable resin, such as of epoxy resin group, phenol resin group, polyester resin group, plyimide resin group, BT resin group, etc., into a base material of inorganic fiber, such as of glass, silicon, etc., or organic fiber, such as of polyester, polyamide, polyimide, polyacryl, etc, or natural fiber, such as of cotton, paper, etc.

Further, in the embodiment mentioned above, only the printed wiring board 1 was explained to be formed by laminating two (2) layers of the substrates (composed of three (3) layers of the conductor layers), as the example, however, the present invention should not be restricted only to that, but also the printed wiring board can be formed by laminating three (3) or more layers of the substrates (composed of four (4) or more layers of the conductor layers) according to the present invention.

Next, explanation will be given on the printed wiring board 1 in details thereof, according to a second embodiment of the present invention, which is suitable for mounting the electronic parts with higher mounting density thereof, by referring to FIG. 2 and FIGS. 3(a) and 3(b). However, in this second embodiment, the constituent elements or components shown and attached with the same reference numerals or marks indicate the same ones as in the FIG. 1 mentioned above, therefore the explanation in details hereabout will be omitted from for avoiding the duplication thereof.

Figure 2:
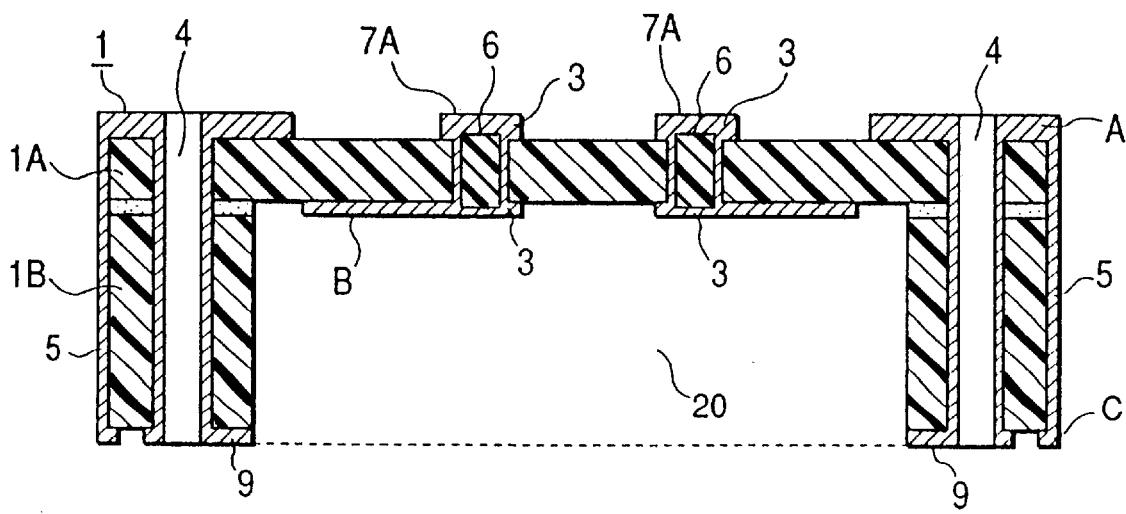
FIG. 2 is a cross-section view of the printed wiring board having a cavity for mounting electronic parts therein, according to another embodiment of the present invention.

As is apparent from the FIG. 2, in particular, the through-holes (see the reference numerals 7 in the FIG. 1 mentioned above) formed in the upper wiring substrate 1A of the printed wiring board 1, according to the second embodiment, are in a form of the so-called the flat through-holes, so as to form the conductor layers 3 for mounting the electronic parts thereon with aggressively utilizing the upper and lower surfaces of those through-holes, thereby enabling the mounting of the electronic parts with the higher mounting density thereof.

Figure 3A:
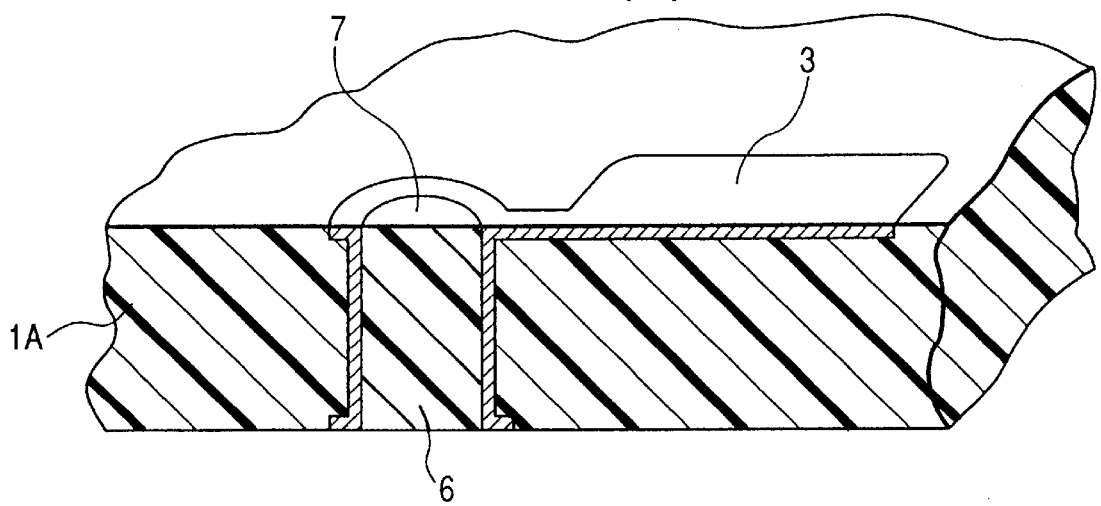
FIGS. 3(a) and (b) are enlarged perspective views for showing portions of the printed wiring boards shown in the FIGS. 1 and 2, including the cross-section view thereof.
Figure 3B:
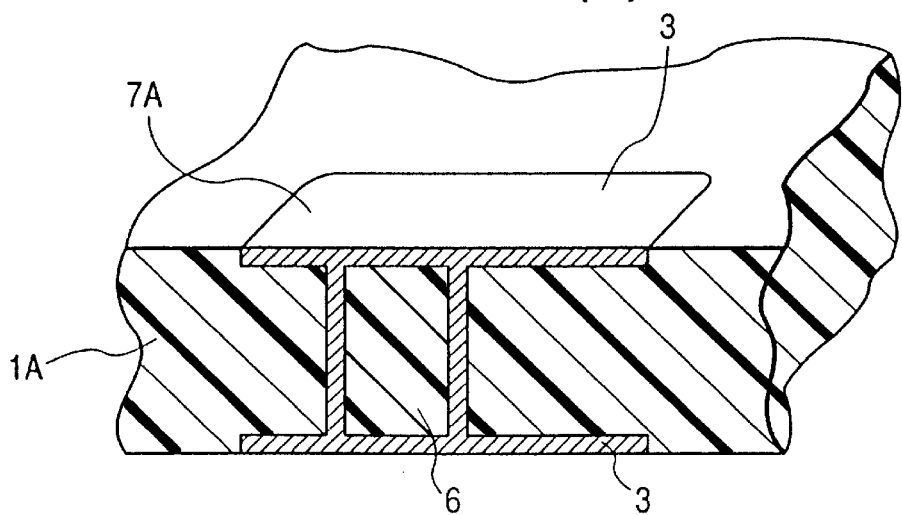

Namely, as shown in FIG. 3(a), the conductor layer 3, such as the connector land, the bonding pad, the connector pad, etc., is formed separating from the through-hole 7 in the structure of the through-hole formed in the upper wiring substrate 1A of the printed wiring board 1 shown in the FIG. 1. On the contrary, with forming the through-hole 7 in the form of the flat through-hole, as shown in the FIG. 3(b), since even the upper and lower surfaces of the through-hole 7 can be utilized as the conductor layers 3 for mounting the electronic parts thereon, aggressively, therefore it is possible to obtain the mounting of the electronic pars with the higher density thereof.

In addition thereto, according to the structure of such the flat through-hole 7A, due to the aggressive utilization of the upper and lower surfaces of the through-hole 7, in particular, it is possible to form the conductor layer 3, such as the connector pad, with a larger area thereof on the lower or reverse side surface of the upper wiring substrate 1A (i.e., the wall surface defining the cavity, which functions as the storage space for the electronic part(s)). Namely, with such the structure of the flat through-hole 7A, it is possible to realize the boding of the electronic part through the conductor layer 3 of such large area, in mechanically high strength and in electrically high certainty, even if a circuit component or element of relatively large size is received to be mounted within the cavity 20.

Next, explanation will be given on the printed wiring board 1 in details thereof, according to a third embodiment of the present invention, by referring to FIG. 4. However, in this third embodiment, the constituent elements or components attached with the same reference numerals or marks indicate the same ones as in the FIGS. 1 and 2 mentioned above, therefore the explanation in details thereof is also omitted from for avoiding the duplication thereof.

In this printed wiring board according to the third embodiment of the present invention, as apparent from the figure, the lower plate body 1B of the printed wiring board 1 is thinner in the thickness than that of those shown in the FIGS. 1 and 2 mentioned above, and in particular, in the place of forming the external electrodes 5 on the side-end surface of the printed wiring board 1, a so-called bottomed through-hole 4' are formed, each being closed at the lower end surface by the conductor layer C.

With such the construction of the printed wiring board 1 according to the third embodiment, since the mounting or packaging of the electronic parts with higher density thereof can be achieved by the mounting of the printed wiring board 1 through the surface-bonding on the motherboard, by using the metal conductor 8 closing the above-mentioned bottomed through-hole 4' at the lower end surface thereof, as well as by the flat through-hole mentioned above, it is possible to contribute for the mounting or packaging of the electronic parts with the higher density, comparing to the cases of using the side-end surface electrodes mentioned above.

Next, explanation will be given on the manufacturing method of the printed wiring board 1 in details thereof, in particular, the structure shown in the above FIG. 2, by referring to FIGS. 5(a) to 5(c) and FIGS. 6(a) to 6(d).

Figure 5A:
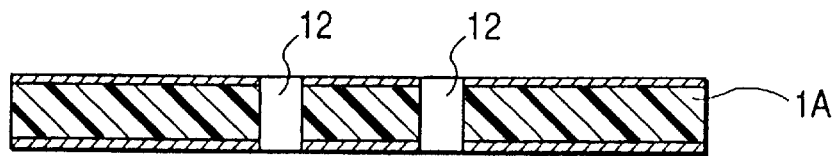
FIGS. 5(a) to 5(c) are views for showing steps of a manufacturing method of the printed wiring board shown in the FIG. 2, according to the present invention, in particular a pre-processing thereof.
Figure 5B:
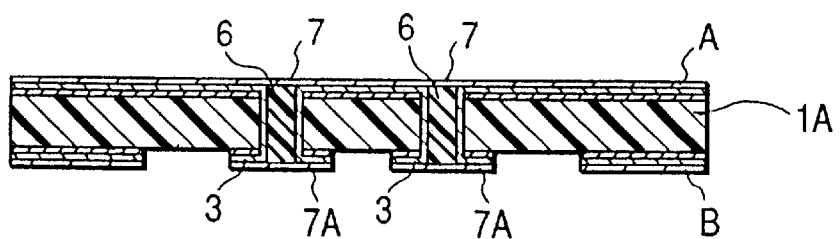
Figure 5C:
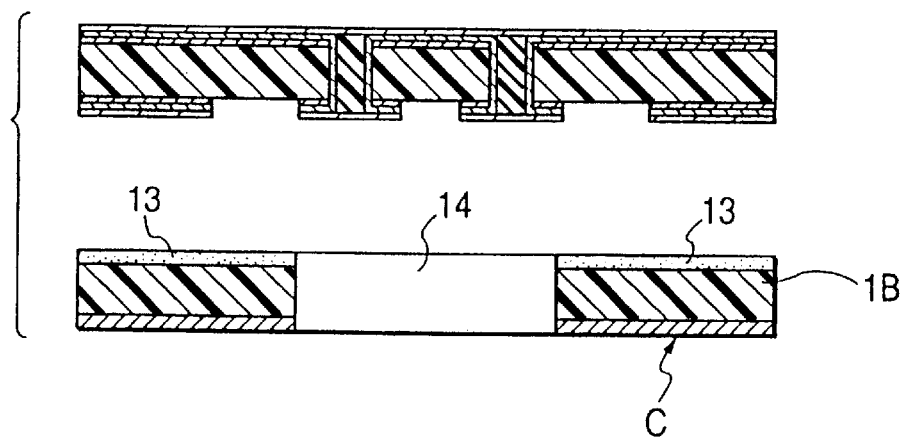

First, a pre-processing of the manufacturing method of the printed wiring board, according to the present invention, will be shown in the FIGS. 5(a) to 5(c). As shown in the FIG. 5(a), NC (numerically controlled) bores 12 of predetermined diameters are opened at predetermined positions on the upper wiring substrate 1A made of a plate laminated with copper-foils on both surfaces thereof. Next, as shown in FIG. 5(b), upon both surfaces of the upper wiring substrate 1A, and further into the above-mentioned NC bores 12 formed, non-electrolytic plating or/and electrolytic plating is/are treated with, thereby to form the plated through-holes 7 for electrically connecting the copper foils on both side surfaces of the upper wiring substrate. After this, into insides of the plated through-holes 7 disposed on a surface (the lower surface) within a region of a receiving or storage space of an electronic part(s) (i.e., the above-mentioned cavity 20) are filled up with fillers 6, such as of thermal-curable resin or/and an ultraviolet ray-curable resin, which is small in contraction rate and is resistant to acid, so as to make the buried through-hole 7, for the purpose of preventing flux, sealing resin, processing liquid, etc., from penetrating through the upper wiring substrate 1A in the processing thereafter. Further, on both end-surfaces of the buried through-holes 7 filled up with the fillers 6 are formed second plating layers contacting with the above-mentioned buried through-holes 7 through non-electrolytic plating or/and electrolytic plating, and thereafter the conductor layers 3, such as the connector lands, circuit conductors, etc., only on the reverse side surface (the lower surface) of the upper wiring substrate 1A, i.e., the plate laminated with copper-foils on both surfaces thereof. The above forming of the conductor layers 3 is conducted through, for example, a photographic method, a printing method, etc., for the purpose of forming the predetermined circuit conductors, the connector lands, etc., only on the reverse side surface (the lower surface) of the upper wiring substrate 1A. Those processes up to the above are called by a first ($1^{st}$) step, and it is for forming the circuit conductor layer B on the reverse side surface of the upper wiring substrate 1A.

However, as will be apparent from the explanation that will be given later, the formed second plating layer is provided for the purpose of forming the metal conductor layers (land portions) on the buried through-holes 7 filled up with the fillers 6 therein, so as to contact therewith, thereby constructing the so-called flat through-holes 7A. And, according to the present invention, the flat end surface on one side of the buried through-hole 7 or on both sides thereof is/are made to be the conductor layers 3, to form the circuit conductors or/and the connector lands for electronic parts, thereby achieving the mounting of the electronic parts with the higher density thereof.

Next, as shown in a lower portion of the FIG. 5(c), on the other side (the upper surface in the figure) of an insulating resin layer of a plate laminated with copper-foil on one side, an adhesive layer 13 is formed by means of prepreg, adhesive, adhesive sheet, etc., in half-cured condition, and further a penetrating hole 14 of predetermined shape is opened on a predetermined position (corresponding to the forming region of the cavity 20) by means of, such as press working, rooter machining, milling, etc., thereby preparing the lower plate body 1B. This process is called a second step.

Further herein, as the adhesive layer 13, it is preferable to apply an adhesive of low-flow type or an adhesive sheet, so that the less of adhesive flows out into the penetrating hole 14 in the processing thereafter. In the above-mentioned second step for preparing this lower plate body 1B, it is also possible to adapt the both-sided copper-foil-laminated plate (see the reference mark 1A in the figure), in the place of the one-sided copper-foil-laminated plate mentioned above, so as to laminate it on the upper wiring substrate 1A through the prepreg, adhesive, adhesive sheet, etc., thereby making up the multi-layered board.

Next, explanation will be given on a post-processing of the manufacturing method of the printed wiring board according to the present invention, by referring to FIGS. 6(a) to 6(d).

Figure 6A:
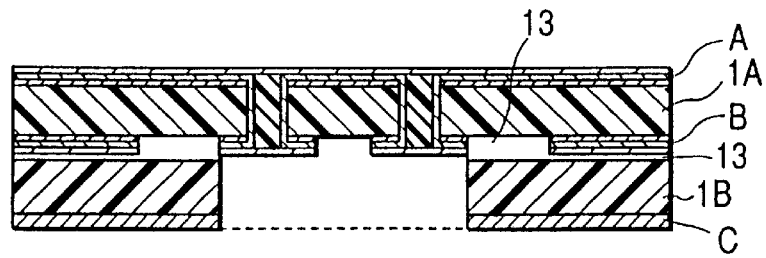
FIGS. 6(a) to 6(d) are views for showing steps of a manufacturing method of the printed wiring board shown in the FIG. 2, according to the present invention, in particular a post-processing thereof.

First, as shown in the FIG. 6(a), on the reverse side surface of the upper wiring substrate 1A formed in the first ($1^{st}$) step mentioned above, the lower plate body 1B formed in the second ($2^{nd}$) step is bonded with heating and compression via the above-mentioned adhesive layer 13 under the half-cured condition, thereby being formed in one body. As an example of the condition of the bonding with heating and compression, the pressure of 50–70 kgf/cm$^2$ is as about two (2) times large as is applied in normal, under the temperature about 140–180° C., and for about 60 minutes.

Figure 6B:
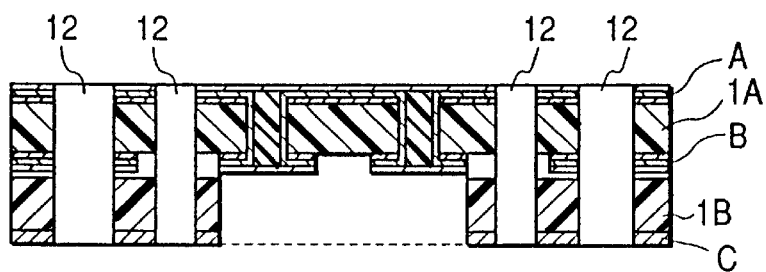

Next, as shown in the FIG. 6(b), in an outside of the region of forming the above-mentioned cavity 20, NC bores 12 of desired diameter are opened at predetermined positions, penetrating through the upper wiring substrate 1A and the lower plate body 1B, which are laminated onto each other in one body.

Figure 6C:
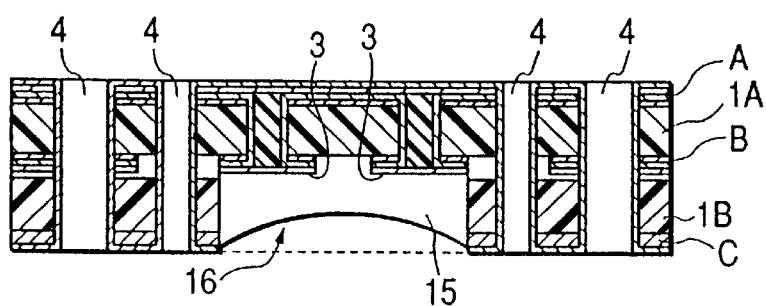

Further, as shown in the FIG. 6(c), upon those upper wiring substrate 1A and the lower plate body 1B, being laminated in one body, non-electrolytic plating or/and electrolytic plating is/are treated with, thereby to form the plated through-holes 4, for electrically connecting between the conductor layers on both side surfaces of the substrate (between A and B and C) in one body (i.e., the plated through-holes located in an inner side in the figure), and further the other through-holes 4 (i.e., the plated through-holes located in an outer side in the figure), to be formed into the side-end surface electrodes 5 for mounting the printed wiring board 1 onto the motherboard, etc.

Then, for preventing the conductor layers 3, such as the connector lands, etc., formed inside the cavity 20 in advance, from being contaminated or damaged caused due to attachment of solder or etcher in the processing hereinafter, such as, a plating process for the plated through-holes, an etching process for forming the circuit conductors on an outer surface layer of the printed wiring board 1, and a plating process of a noble metal(s), etc., thereby bringing about defected circuits and/or poor quality, namely, for the purpose of protection of the conductor layers 2 inside the cavity 20 from the plating and/or the etching, resin 15, such as thermal curable resin, ultraviolet ray-curable resin, etc., is filled into a hole 16 defining the cavity from an opening at the lower potion thereof, until filled up to the brim so that the end portion of the hole 16 be hidden therewith.

Figure 6D:
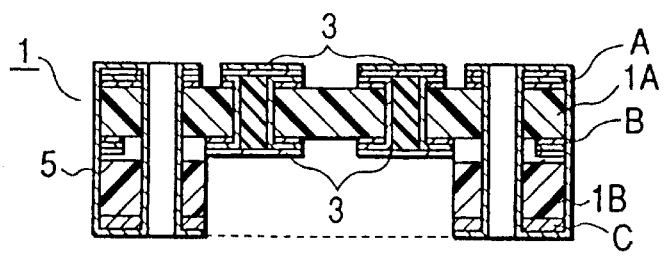
Figure 7A:
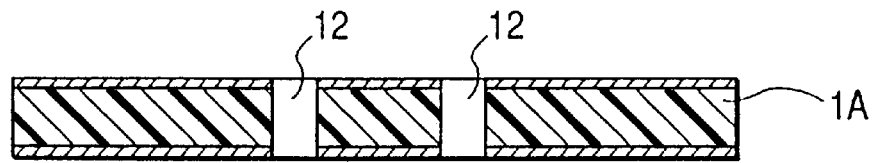
FIGS. 7(a) to 7(c) are views for showing steps of a manufacturing of the printed wiring board shown in the FIG. 4, according to the present invention, in particular a pre-processing thereof.
Figure 7B:
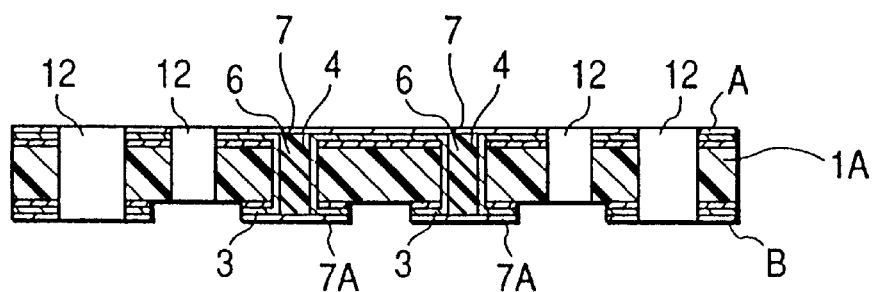
Figure 7C:
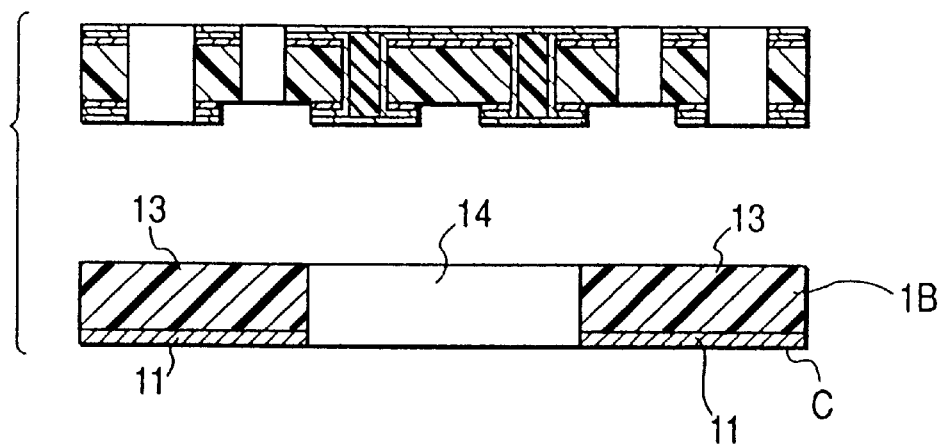
Figure 8A:
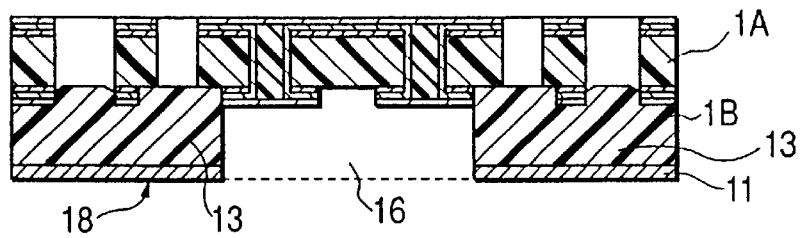
FIGS. 8(a) to 8(d) are views for showing steps of a manufacturing method of the printed wiring board shown in the FIG. 4, according to the present invention, in particular a post-processing thereof.
Figure 8B:
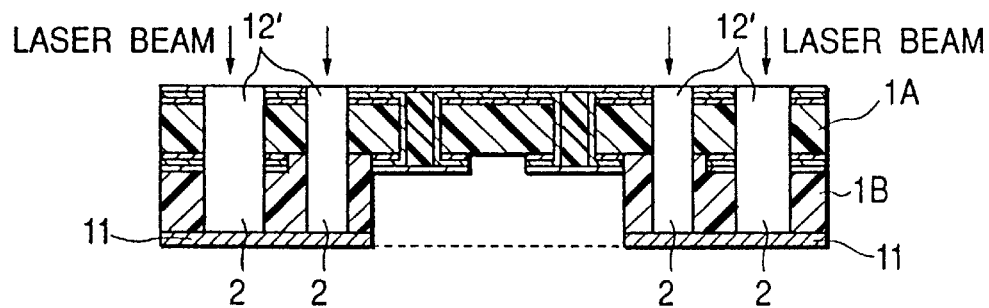
Figure 8C:
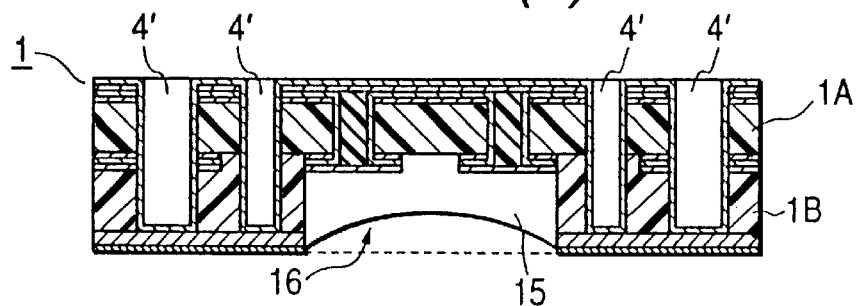
Figure 8D:
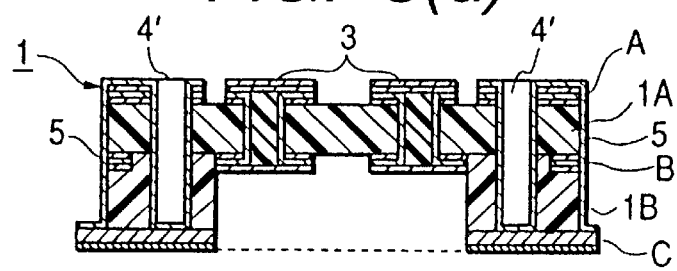

Finally, as shown in the FIG. 6(d), upon the whole surface of the copper foils on an outer layer (maybe including the reverse side surface) of the printed wiring board 1, i.e., the multi-layered wiring board formed by laminating the upper wiring substrate 1A and the lower plate body 1B in one body, etching resists are formed through the printing method or the photographic method, thereby to form the conductor layers 3 as predetermined outer circuit conductors and the connector lands for electronic parts, through the etching process. Thereafter, the resin 15 filled up within the hole 16 mentioned above is removed by dissolution, and the printed wiring board 1 is further cut or separated at those plated through-holes 4 (the plated through-holes located in the outer side), thereby to be completed.

Forming the circuit conductor layer C on the reverse side surface (the lower side surface) of the lower plate body 1B, as well as the circuit conductor layers A and B on front and reverse side surfaces of the upper wiring board 1A, in this manner, allows to obtain a multi-layered wiring board of the substrate, in which the conductor layers are laminated in plural in one body, i.e., the printed wiring board 1 having the cavity, into which the electronic part(s) can be mounted. Further, on the conductor layers 3 forming the circuit conductor layers and the connector lands within the storage hole of electronic parts (i.e., the cavity 20), it is common to form a plating layer of, such as nickel or gold, for obtaining preferable connection with the electronic part(s) to be mounted thereon (not shown in the figure).

Figure 4:
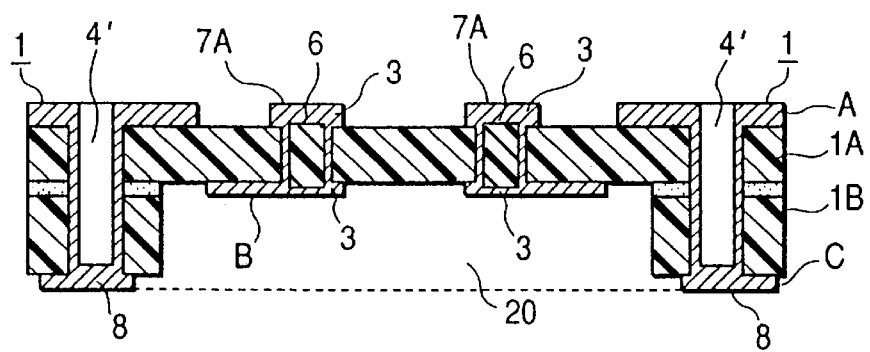
FIG. 4 is a cross-section view for showing a variation of the printed wiring board having cavity for mounting electronic parts therein, shown in the FIG. 2, according to the present invention.

Next, differing from the above, the manufacturing method of the printed wiring board, which structure is shown in the FIG. 4, will be shown in the attached FIGS. 7(a) to 7(c) and FIGS. 8(a) to 8(d). As apparent from those figures, in another manufacturing method, the NC bores 12 are opened in the upper wiring substrate 1A in advance, and thereafter, through processing, such as etching, etc., the bottomed through-holes 12', each of which is closed by the metal conductor at the one end surface (the bottom surface), are formed in the printed wiring board 1.

In the manufacturing methods mentioned above, two (2) kinds of plated through-holes 4 (or the bottomed through-holes 4') are formed in the printed wiring board 1, and are cut at the central portion thereof, so as to form the side-end surface electrodes 5 to be mounted onto the motherboard or the like. However, in a case of cutting at the central portion of the plated through-holes 4 (or the bottomed through-holes 4') formed in the inner side, which are inherently formed for interconnecting the both side surfaces of the printed wiring board 1, the side-end surface electrodes 5 being same to the above also can be obtained (however, in this case, the side-end surface electrodes 5 also functions as the electrodes of the plated through-holes in common), therefore it is enough to form the plated through-holes 4 (or the bottomed through-holes 4') provided only in the inside. Also, in particular, in a case of forming the bottomed through-holes 4', each of which is closed by the metal conductor at the one end surface (the bottom surface), it is possible to mount the printed wiring board 1 on the motherboard or the like through the conductor layer C (the metal conductor layer 8 in the above FIG. 4) on the lower end surface thereof, accordingly there is no such necessity of forming the external electrodes 5 on the side-end surfaces of the printed wiring board 1, with using such the plated through-holes 4 (or the bottomed through-holes 4') in the inside thereof, as was mentioned in the above.

Figure 9:
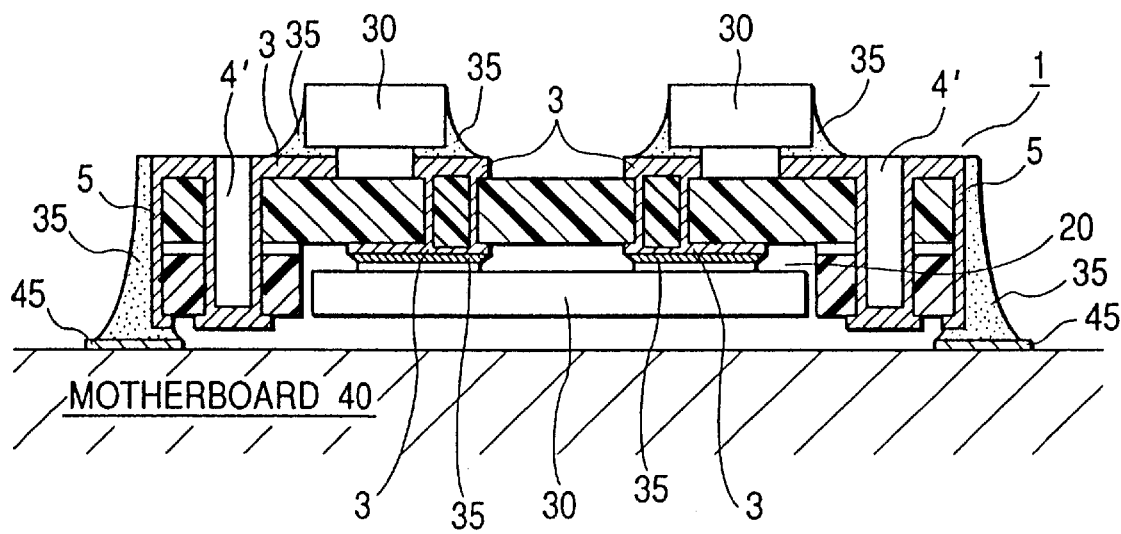
FIG. 9 is cross-section view for showing a condition, wherein the printed wiring board, being manufactured by the manufacturing method shown in the FIGS. 7 and 8 and loaded with tip-like electronic parts thereon in a form of a module, is mounted on a motherboard.

FIG. 9 shows the condition of the printed wiring board 1 shown in the FIG. 2, where it is mounted with the electronic parts thereon, to be in a form of the board, and then it is mounted on the motherboard 40.

Figure 10:
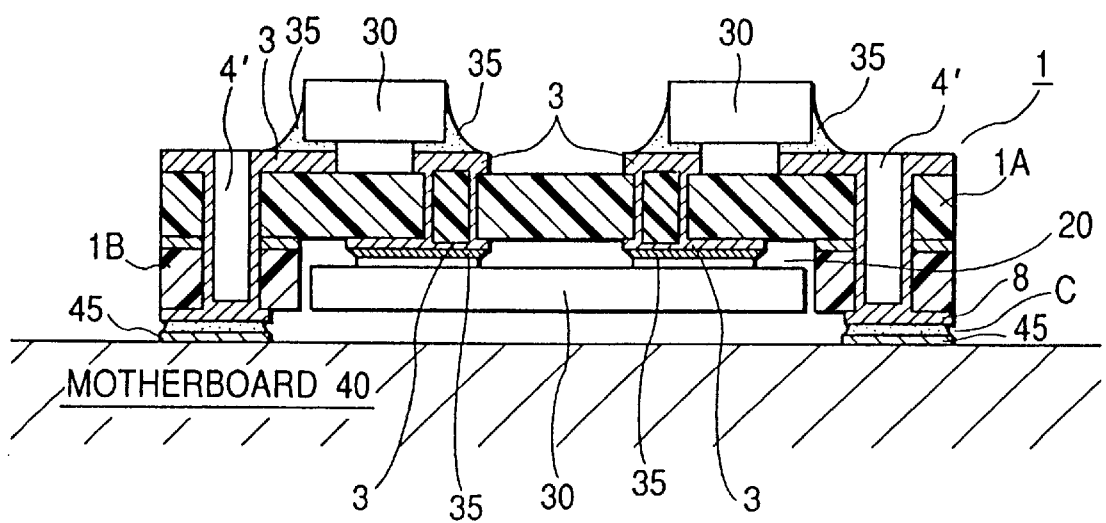
FIG. 10 is a cross-section view for showing a condition, wherein the printed wiring board, being shown in the FIG. 4 in the structure thereof and loaded with tip-like electronic parts thereon in a form of a module, is mounted on the motherboard.
Figure 11:
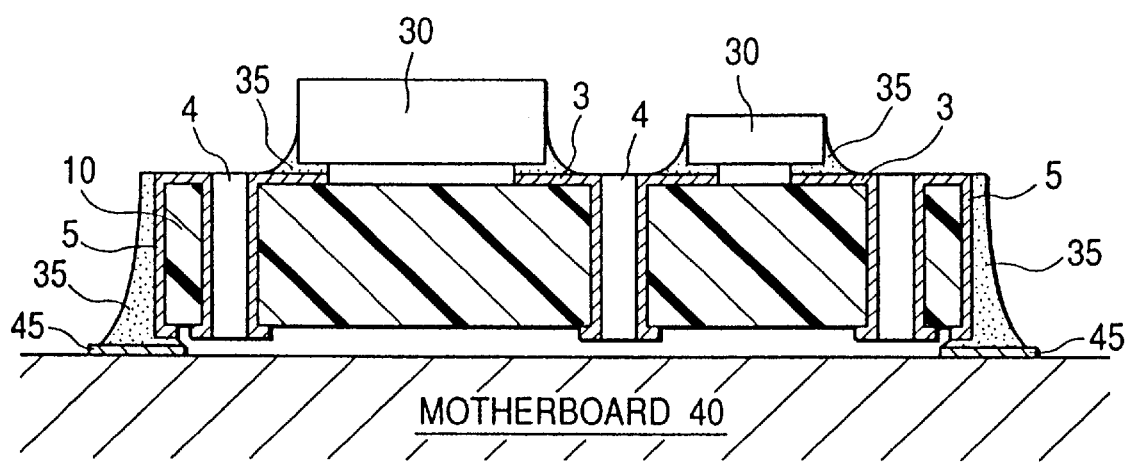
FIG. 11 is a cross-section view for showing a condition, wherein the conventional printed wiring board, being loaded with tip-like electronic parts thereon in a form of a module, is mounted on the motherboard.

Also, FIG. 10 shows the condition of the printed wiring board 1 shown in the FIG. 4, in particular, where it is mounted with the electronic parts thereon, to be in a form of the board, and then it is mounted on the motherboard 40. Namely, in this example, no side-end surface electrode 5 is formed on the printed wiring board 1, but in the place thereof, the printed wiring board 1 is connected to connector terminals 45 on the motherboard 40 through the metal conductor layers 8 of the conductor layer C (see the above-mentioned FIG. 4) at the lower end of the bottomed through-holes 4' formed.

Further, with the printed wiring board 1 according to the present invention, in particular if the thickness of the lower plate body 1B thereof is set to be larger (in other words, deeper in the depth of the cavity 20) than those of the embodiments shown in the FIGS. 1 and 2 mentioned above, it is also possible to receive or store even an electronic part having relatively large sizes (height, length, width) thereof, such as a functional part, including a SAW filter, etc.

In more details, if the total thickness of the printed wiring board 1 is t=1.6 mm, the depth (h) of the opened hole for defining the cavity 20, i.e., the space for receiving or storing electronic parts therein is preferable to lies within a range 30%–90% of the total thickness (t) of the printed wiring board 1. According to this, it is also possible to mount the chip-like electronic part(s) having the thickness, for example, 0.3 mm–1.2 mm, being relatively large, of such as a hybrid ICs, light receiving and/or emitting elements, sensor components, etc.

However, if the depth (h) of the above opened hole is less than 30% of the total thickness (t) of the printed wiring board 1, it is difficult to receive or store the large-sized chip-like part(s), such as the hybrid IC, etc., completely therein. On the other hand, if it exceeds over 90% of the total thickness (t), mechanical strength on the remaining part (in more particular, of the upper wiring substrate 1A) of the printed wiring board 1 comes to be weak in the direction of thickness, then damages of cracks and/or breakages are likely to occur in the through-holes 7 or the flat through-holes 7A, as well as on the conductor layers 3, such as, the connector lands, the bonding pads, the connector pads, etc., for connecting the electronic parts thereon, which are formed on the remaining part thereof (i.e., the thin upper wiring substrate 1A), and further shortage in thermal resistance thereof, thereby lowering reliability in quality of the products manufactured.

Furthermore, after mounting the electronic part, such as the functional part of the SAW filter, etc., within the cavity 20 as the storage space for electronic parts, further hermetically sealing gaps between them by means of resin or molding material enables to improve the properties of the electronic part(s) to be mounted therein, in particular, in moisture-proof property and/or corrosion-proof property, therefore it is preferable for mounting of such the SAW filter, which necessitates such the sealing structure.

As was fully mentioned in the above, according to the printed wiring board having such the cavity for mounting electronic parts therein and a method for manufacturing thereof, the following effects can be achieved:

It is possible to provide the printed wiring board having the cavity for mounting electronic parts therein and a method for manufacturing thereof, in which various kinds of electronic parts can be mounted, not only on the upper surface of the printed wiring board, but also on the reverse side surface thereof, through surface-bonding with forming circuit conductor layers thereon, there by enabling the mounting of the electronic parts thereon with high density and high reliability.

And, it is also possible to mount the electronic parts on the printed wiring board, with much higher density and certainty, in particular, by applying the flat through-hole to form the conductor layers, on which the electronic parts are mounted through surface-bonding.

While we have shown and described several embodiments in accordance with our invention, it should be understood that the disclosed embodiments are susceptible of changes and modifications without departing from the scope of the invention. Therefore, we do not intend to be bound by the details shown and described herein but intend to cover all such changes and modifications falling within the ambit of the appended claims.

What is claimed is:

1. A printed wiring board, comprising:
    an upper plate-like wiring substrate having conductive layers formed upon top and bottom surfaces thereof, wherein said upper wiring substrate has a first plated through-hole formed therein which is filled with a non-conductive material;
    a lower wiring substrate attached on said bottom surface of said upper wiring substrate, wherein said lower and upper wiring substrates combine to form a body having a cavity to receive a first electronic part within an inside thereof;
    a first connector land to mount the first electronic part thereupon, being provided with one of the conductive layers formed on a bottom surface of said first plated through-hole, which is formed on said bottom surface of said upper wiring substrate within the cavity; and
    a first external electrode, formed with a second plated through-hole, to electrically conduct between one of the conductive layers on the top surface of the upper wiring substrate and a conducive layer formed on a bottom surface of said lower wiring substrate,
    wherein said first external electrode is formed on a side-end surface of the body of said printed wiring board formed by combining said upper wiring substrate and said lower wiring substrate.

2. A printed wiring board, as defined in the claim 1, wherein said upper wiring substrate and said lower wiring substrate are comprised of material of a thermally-curable resin group.

3. A printed wiring board according to claim 2, wherein said non-conductive material which fills said first through-hole is a thermally cured resin material.

4. A printed wiring board according to claim 2, wherein said non-conductive material which fills said first through-hole is an ultraviolet light cured resin material.

5. A printed wiring board, as defined in the claim 1, wherein said second plated through-hole is a bottom-plated through-hole, which is closed at a lower end by a metal conductor, which passes through said upper wiring substrate and said lower wiring substrate in said body.

6. A printed wiring board according to claim 1, wherein said second plated through-hole is a bottom-plated through-hole, which is closed at a lower end by a metal conductor, which passes through said upper wiring substrate and said lower wiring substrate in said body.

7. A printed wiring board according to claim 1, further comprising a second external electrode formed with a third plated through-hole to electrically conduct between another of said conductive layers on the top surface of the upper wiring substrate and another conductive layer on the bottom surface of the lower wiring substrate, said second external electrode being formed on an opposite side-end surface of the body of said printed wiring board formed by combining said upper wiring substrate and said lower wiring substrate.

8. A printed wiring board according to claim 7, wherein said third plated through-hole is a bottom-plated through-hole, which is closed at a lower end and by a metal conductor, which passes through said upper wiring substrate and said lower wiring substrate in said body.

9. A printed wiring board according to claim 1, further comprising a second connector land to mount a second electronic part thereon, wherein said second connector land is provided with one of the conductive layers formed on the top surface of the first plated through-hole which is formed on the top surface of the upper wiring substrate.

10. A printed wiring board according to claim 1, wherein said non-conductive material which fills said first through-hole is a thermally cured resin material.

11. A printed wiring board according to claim 1, wherein said non-conductive material which fills said first through-hole is an ultraviolet light cured resin material.

12. A printed wiring board comprising:
- an upper plate-like wiring substrate formed of a non-conductive material having a first through-hole extending between a top surface and a bottom surface thereof, wherein said first through-hole includes a conductive, side wall layer on a side wall of the first through-hole, said conductive side wall layer extending completely through said first through-hole from the top surface to the bottom surface of the upper wiring substrate, wherein said first through-hole is filled with a non-conductive material extending completely through said first through-hole from said top surface to said bottom surface of said upper wiring substrate, and wherein said upper wiring substrate further includes a first conductive layer formed over a top surface of the first through-hole in the top surface of the upper wiring substrate to cover said non-conductive material which fills said first through-hole and to contact said conductive side wall layer of said first through-hole, said first conductive layer being provided to mount a first electronic part on the top surface of the upper wiring substrate, and
- wherein said upper wiring substrate further comprises a second conductive layer formed over a bottom surface of the first through-hole in the bottom surface of the upper wiring substrate, to cover the non-conductive material of the through-hole and to electrically contact the conductive side wall layer of the first through-hole, said conductive layer being provided to mount a second electronic part on the bottom surface of the upper wiring substrate; and
- a lower wiring substrate formed of non-conductive material, said lower wiring substrate being attached to the bottom surface of the upper wiring substrate, wherein the upper and lower wiring substrates combine to form a body having a cavity formed by the upper and lower wiring substrates to receive the second electronic part to be mounted on the bottom surface of the upper wiring substrate,
- further comprising a first external electrode formed on a second plated through-hole, to electrically conduct between a conductive layer on on the top surface of the upper wiring substrate and a conductive layer formed on a bottom surface of the lower wiring substrate, and
- wherein said first external electrode is formed on a side-end surface of the body of said printed wiring board formed by combining said upper wiring substrate and said lower wiring substrate.

13. A printed wiring board according to claim 12, wherein the non-conductive material forming the upper and lower wiring substrates and the non-conductive material filling the first through-hole are comprised of resin materials.

14. A printed wiring board according to claim 13, wherein the resin materials are thermally-cured resin materials.

15. A printed wiring board according to claim 12, wherein said second plated through-hole is a bottom-plated through-hole, which is closed at a lower end by a metal conductor, which passes through said upper wiring substrate and said lower wiring substrate in said body.

16. A printed wiring board according to claim 12, wherein said second plated through-hole is a bottom-plated through-hole, which is closed at a lower end by a metal conductor, which passes through said upper wiring substrate and said lower wiring substrate in said body.

* * * * *